United States Patent
Wang et al.

(10) Patent No.: US 11,546,986 B2
(45) Date of Patent: Jan. 3, 2023

(54) FOLDABLE SUPPORT AND DISPLAY DEVICE

(71) Applicant: BOE TECHNOLOGY GROUP CO., LTD., Beijing (CN)

(72) Inventors: Haoran Wang, Beijing (CN); Fangxu Cao, Beijing (CN); Liming Dong, Beijing (CN); Yonghong Zhou, Beijing (CN); Xueyang Cao, Beijing (CN); Shaokui Liu, Beijing (CN); Wei Qing, Beijing (CN); Xingguo Liu, Beijing (CN); Zhihui Wang, Beijing (CN); Qiang Tang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 171 days.

(21) Appl. No.: 16/815,180

(22) Filed: Mar. 11, 2020

(65) Prior Publication Data

US 2021/0168929 A1 Jun. 3, 2021

(30) Foreign Application Priority Data

Nov. 28, 2019 (CN) .......................... 201911190255.8

(51) Int. Cl.
  *H05K 1/02* (2006.01)
  *G06F 1/16* (2006.01)
  *H05K 3/42* (2006.01)

(52) U.S. Cl.
  CPC ........... *H05K 1/028* (2013.01); *G06F 1/1652* (2013.01); *H05K 3/427* (2013.01)

(58) Field of Classification Search
  CPC ........ H05K 1/02; H05K 1/028; H05K 1/0278; H05K 5/00; H05K 5/02; H05K 3/427; G06F 1/1652; G06F 1/1601
  USPC ........................ 361/749–750, 775–778, 803; 174/254–259; 349/149–151
  See application file for complete search history.

(56) References Cited

U.S. PATENT DOCUMENTS

| 10,411,204 B2 | 9/2019 | Li et al. |
| 2015/0043174 A1* | 2/2015 | Han ..................... G02F 1/13452 428/156 |
| 2015/0091413 A1* | 4/2015 | Lee ......................... H01L 27/20 310/328 |

(Continued)

FOREIGN PATENT DOCUMENTS

| CN | 107507518 A | 12/2017 |
| CN | 108257971 A | 7/2018 |

(Continued)

OTHER PUBLICATIONS

First Office Action for CN Patent Application No. 201911190255.8 dated Apr. 2, 2021.

*Primary Examiner* — Tuan T Dinh
(74) *Attorney, Agent, or Firm* — Xsensus LLP

(57) ABSTRACT

The present disclosure provides a foldable support, and a display device. The foldable support includes at least two metal layers, where at least one of the at least two metal layers is provided with a plurality of recessed portions at the at least one bending region; and a buffer structure located at at least one of the following positions: a position between two adjacent metal layers and a position in a plurality of the recessed portions of the at least one of the at least two metal layers.

11 Claims, 6 Drawing Sheets

(56) References Cited

U.S. PATENT DOCUMENTS

| | | | |
|---|---|---|---|
| 2015/0192951 A1* | 7/2015 | Chong | G06F 1/1643 |
| | | | 359/894 |
| 2015/0382446 A1* | 12/2015 | Kwon | H05K 1/147 |
| | | | 174/251 |
| 2016/0357052 A1* | 12/2016 | Kim | G06F 1/1652 |
| 2018/0190936 A1* | 7/2018 | Lee | B32B 15/04 |
| 2018/0192527 A1* | 7/2018 | Yun | G06F 1/1652 |
| 2019/0036068 A1* | 1/2019 | Kim | G06F 1/1652 |
| 2019/0132987 A1* | 5/2019 | Koo | H05K 5/0217 |

FOREIGN PATENT DOCUMENTS

| | | |
|---|---|---|
| CN | 208141720 U | 11/2018 |
| CN | 109560088 A | 4/2019 |
| CN | 109671718 A | 4/2019 |
| CN | 109903679 A | 6/2019 |

\* cited by examiner

FOLDABLE SUPPORT AND DISPLAY DEVICE

CROSS REFERENCE TO RELATED APPLICATION

This application is based upon, and claims the benefit of and priority to Chinese Patent Application No. 201911190255.8, filed on Nov. 28, 2019, the entire contents thereof being incorporated herein by reference.

TECHNICAL FIELD

The present disclosure relates to the field of display technology and, in particular, to a foldable support, a fabricating method thereof, and a display device.

BACKGROUND

With the diversification of flexible display products, foldable display products are favored by users due to their portability and large size expansion. Existing foldable display products are based on a flexible material, which enables the folding display product to achieve a bending effect. Flexible substrates, however, are prone to appearance defects such as creep and irregular curl in a high temperature environment, which affects the realization of the foldable display and also affects the normal display of the display products. Therefore, currently, a foldable support is usually provided on the back of a flexible display panel to support the flexible display panel.

However, current foldable supports need to be improved.

SUMMARY

In one aspect of the present disclosure, the present disclosure provides a foldable support. The foldable support is provided with a non-bending region and at least one bending region. The foldable support includes: at least two metal layers, at least one of the at least two metal layers being provided with a plurality of recessed portions at the bending region; a buffer structure, which is located at at least one of the following positions: a position between two adjacent metal layers and a position in the plurality of recessed portions of the at least one of the at least two metal layers. Therefore, the foldable support not only has good supportability, but also effectively disperses stress during bending so that the folding performance of the foldable support and the performance of restoring flatness after bending are effectively improved.

According to an embodiment of the present disclosure, a depth of the recessed portions is smaller than a thickness of the metal layers, and the recessed portions are disposed on both sides of each of the metal layers. Therefore, the plurality of recessed portions on both sides of each of the metal layers can match different bending radii during bending, respectively, the bending performance of the foldable support and the performance of restoring flatness after bending are improved.

According to an embodiment of the present disclosure, the recessed portions are configured to extend through the at least two metal layers. Therefore, the recessed portions have a longer stress release path, which can improve the ability of the metal layers to disperse stress, a plurality of metal layers having the above-described recessed portions cooperate with each other, and the plurality of recessed portions in different metal layers can respectively match different bending radii, thereby further improving the bending performance of the foldable support and the performance of restoring flatness after bending.

According to an embodiment of the present disclosure, the foldable support is configured to meet at least one of the following conditions: materials of the at least two metal layers are not completely the same; a thickness of each of the at least two metal layers are in the range of 0.015 to 0.5 mm; a thickness of each of the at least two metal layers is less than 0.1 mm at the bending region when the at least two metal layers are not provided with the recessed portions at the bending region. Therefore, the foldable support is provided with a good bending effect.

According to an embodiment of the present disclosure, the at least two metal layers are made of materials including a hard metal which includes at least one of special steel, nickel, titanium, nickel alloy, and titanium alloy. When at least one of the at least two metal layers are made of hard metal, the other metal layers are made of materials further including a soft metal which includes at least one of copper, silver, tin, copper alloy, silver alloy, and tin alloy. Therefore, the foldable support has a good folding effect, and also has good heat dissipation and electrical conductivity, which can match different functional requirements of the flexible display panel.

According to an embodiment of the present disclosure, a friction coefficient between two adjacent metal layers at the bending region is less than 0.5. Therefore, the friction between the adjacent two metal layers at the bending region is small so that the portions of the adjacent two metal layers at the bending region can slide relative to each other, when bending, the bending stress of two adjacent metal layers will not be transmitted to each other, that is, the lower metal layer is not affected by the bending stress of the upper metal layer. The metal layer described above can be bent according to the bending radius of the upper metal layer, and the lower metal layer can be bent according to the bending radius of the lower metal layer. The bending regions of the upper and lower metal layers can independently match different bending radii, so that the plurality of recessed portions of different metal layers can be better matched with different bending radii, and the bending limit ability of the foldable support is improved. Additionally, the bending performance of the foldable support and the performance of restoring flatness after bending are significantly improved.

According to an embodiment of the present disclosure, an air gap is provided between two adjacent metal layers at the bending region, or a single-sided adhesive layer is provided between two adjacent metal layers at the bending region, and the single-sided adhesive layer is attached to the metal layers, or a lubricating layer is provided between two adjacent metal layers at the bending region, or a side of a metal layer facing a metal layer adjacent thereto is surface-treated at the bending region. Therefore, the two adjacent metal layers can be caused to slide relative to each other at the bending region.

According to an embodiment of the present disclosure, an air gap is provided between two adjacent metal layers at the bending region, and a length of the air gap in a thickness direction of the metal layers is less than 200 μm. Therefore, in the case where relative sliding between two adjacent metal layers at the bending region is ensured, the flexible display panel is prevented from being depressed due to an excessive air gap.

According to an embodiment of the present disclosure, the buffer structure is located in the plurality of recessed portions of the at least two metal layers, and two adjacent metal layers are connected by welding or a structural component at the non-bending region. Therefore, the adjacent metal layers can be connected at the non-bending region through the above-described method.

According to an embodiment of the present disclosure, a material of the at least two metal layers at the bending region is different from a material of the at least two metal layers at the non-bending region, and an elastic modulus of the material of the at least two metal layers at the non-bending region is greater than an elastic modulus of the material of the at least two metal layers at the bending region. Therefore, the bending performance of the foldable support in the bending region can be further improved, and at the same time, the foldable support has higher support performance in the non-bending region.

According to an embodiment of the present disclosure, the foldable support further includes at least one of the following structures: a graphite copper layer, which is located at a side of a metal layer facing away from other metal layers at the non-bending region; and a polymer layer, which is located at a side of a metal layer facing away from the other metal layers at the bending region. Therefore, while ensuring that the foldable support has a good bending effect, not only can the foldable support obtain good heat dissipation and electrical conductivity, but also the foldable support can obtain a thinner thickness.

According to an embodiment of the present disclosure, the foldable support includes: two metal layers, each of which having a plurality of the recessed portions at the bending region, and the recessed portions extending through each of the two metal layers; the buffer structure is disposed between the two metal layers at the non-bending region and the bending region; and the buffer structure is also disposed in a plurality of the recessed portions at the bending region. Therefore, the foldable support has a good bending effect.

According to an embodiment of the present disclosure, the foldable support includes: two metal layers, each of which having a plurality of the recessed portions at the bending region, and the recessed portions extending through each of the two metal layers; the buffer structure is disposed between the two metal layers at the non-bending region; and the buffer structure is also disposed in the plurality of the recessed portions at the bending region, two single-sided adhesive layers are disposed between the two metal layers and the two single-sided adhesive layers are respectively attached to the two metal layers, or one single-sided adhesive layers is disposed between the two metal layers, and the one single-sided adhesive layer is attached to a metal layer on one side, and a metal layer on the other side is in contact with a non-adhesive surface of the one single-sided adhesive layer. Therefore, the foldable support has a good bending effect.

According to an embodiment of the present disclosure, a material of the at least two metal layers in the bending region is copper, and a material of the at least two metal layers in the non-bending region is stainless steel. A graphite copper layer is disposed on a side of a metal layer facing away from the other metal layers at the non-bending region, a polymer layer is disposed on a side of a metal layer facing away from the other metal layers at the bending region, and the graphite copper layer and the polymer layer are disposed on the same layer. Therefore, the foldable support has a good bending effect, and has good electrical conductivity and heat dissipation performance.

According to another aspect of the present disclosure, a fabricating method of the foldable support is provided, including: providing at least two metal layers, each of which having a non-bending region and at least one bending region; performing a patterned opening process on a portion of at least one of the at least two metal layers located in the bending region to form a plurality of recessed portions; providing a buffer structure, and the buffer structure is disposed at at least one of the following positions: a position between two adjacent metal layers and a position in a plurality of the recessed portions of the metal layers.

According to another aspect of the present disclosure, the present disclosure provides a display device. According to an embodiment, the display device includes a flexible display panel and a foldable support. The foldable support is described above and is located on a side facing away from a display surface of the flexible display panel. Therefore, the display device has all the features and advantages of the foldable support described above, which are not repeated here. In general, the flexible display panel has a good folding effect and a good display effect.

According to an embodiment of the present embodiment, the display device is configured to meet at least one of the following conditions: a flat layer is included which is disposed between the foldable support and the flexible display panel; and the foldable support includes a hard metal layer and a soft metal layer, where the hard metal layer is disposed near the flexible display panel. Therefore, the foldable support has good folding effect and good display effect.

BRIEF DESCRIPTION OF THE DRAWINGS

The above and/or additional aspects and advantages of the present disclosure will become apparent and easily understood from the description of the embodiments in conjunction with the following drawings, in which.

DETAILED DESCRIPTION

Figure 1:
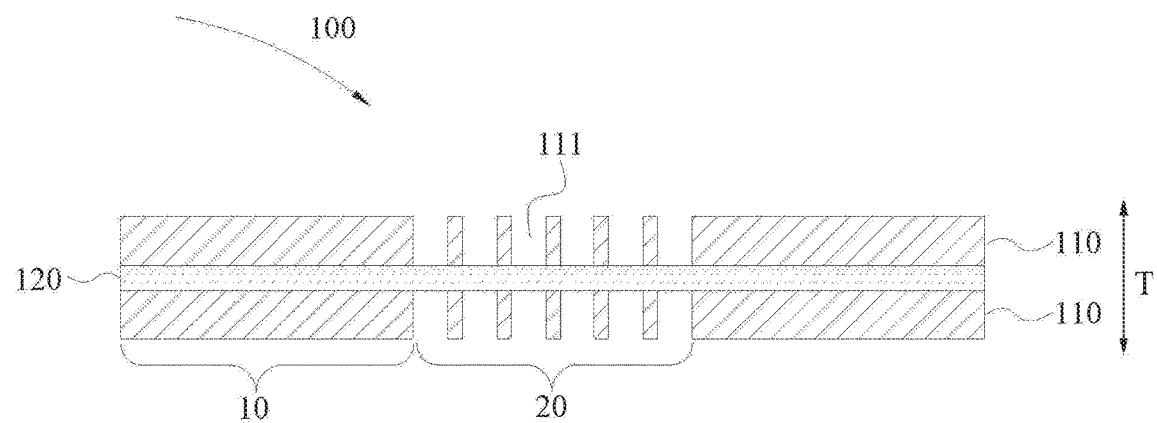
FIG. 1 is a schematic structural diagram of a foldable support according to an embodiment of the present disclosure.

Hereinafter, embodiments of the present disclosure will be described in detail. Examples of the embodiments are shown in the accompanying drawings, where the same or similar reference numerals represent the same or similar elements or elements having the same or similar functions from beginning to end. The embodiments described below with reference to the drawings are exemplary and are only used to explain the present disclosure, and should not be construed as limiting the present disclosure.

This disclosure is based on the inventor's discovery and knowledge of the following facts and problems.

At present, supports in foldable display products are usually composed of hard materials. Although the above-mentioned supports have a good supporting effect on the flexible display panel, when the flexible display panel is bent, due to a small deformation of the support, that is, the bending ability of the support is poor, easy peeling between the flexible display panel and the support is known to occur. In addition, when the flexible display panel is restored from a bent state to a flat state, the support has a poor ability to restore flatness, and it is easy to form creases in the bending region, which affects the folding effect and display effect of the flexible display panel. The present disclosure is intended to at least partially alleviate or solve at least one of the problems mentioned above.

According to one aspect of the present disclosure, the present disclosure provides a foldable support. According to an embodiment of the present disclosure, referring to FIG. 1, the foldable support 100 has a non-bending region 10 and at least one bending region 20 (only one bending region is shown in the FIG. 1). The foldable support 100 includes: a buffer structure 120 and at least two metal layers 110. In one embodiment, at least one of the at least two metal layers 110 has a plurality of recessed portions 111 at the bending region 20, and the buffer structure 120 is located between two adjacent metal layers 110 (refer to FIG. 1) or the buffer structure 120 is located in the plurality of recessed portions 111 of the at least one of the at least two metal layers 110 (see FIG. 13), or the buffer structure 120 is located between two adjacent metal layers 110 and located in the plurality of recessed portions 111 of the metal layer(s) 110 (see FIGS. 7 to 11). Therefore, the foldable support not only has good supportability, but also effectively disperses stress during bending so that the bending performance of the foldable support and the performance of restoring flatness after bending are effectively improved.

It should be noted that the "recessed portion" in the present disclosure refers to a portion having a hole in the metal layers, such as a portion marked 120 in FIG. 1. The same reference numeral 110 indicates metal layers having the same structure and the same material.

In order to facilitate understanding, the working principle of the foldable support according to the embodiment of the present disclosure is briefly described below.

According to an embodiment of the present disclosure, the metal layers have a plurality of recessed portions at the bending region by patterning the metal layers at the bending region. The plurality of the recessed portions may be filled with air, or the plurality of the recessed portions may be filled with buffer structure. Because the air and the buffer structure can be deformed when the foldable support is bent, then the plurality of recessed portions can be deformed as the foldable support is bent, thereby releasing the bending stress; that is, a plurality of recessed portions can disperse bending stress, thereby increasing the bending degree of the foldable support to match the bending degree of the flexible display panel and reducing the risk of peeling the flexible display panel from the foldable support. When the foldable support is restored to a flat state, a plurality of recessed portions can be restored to the original state, thereby improving the performance of the foldable support to be restored to a flat state after being bent so that the foldable support can obtain a good bending and unfolding effect, which plays a good role in supporting the flexible display panel and can effectively alleviate the occurrence of folds in the bending region. The mutual cooperation of a plurality of the metal layers can enable the foldable support to obtain good bending performance and mechanical performance.

Each structure of the foldable support is described in detail according to specific embodiments of the present disclosure.

Figure 2:
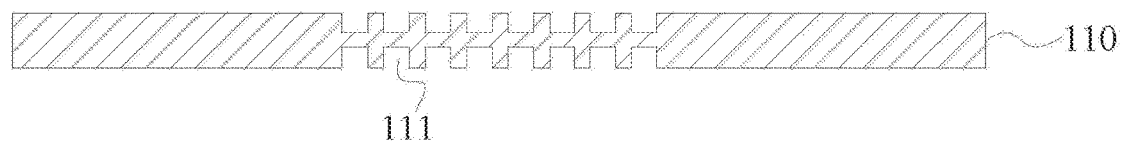
FIG. 2 is a schematic structural diagram of a metal layer according to an embodiment of the present disclosure.
Figure 3:
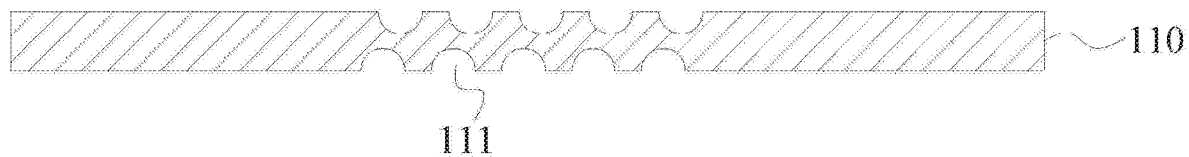
FIG. 3 is a schematic structural diagram of a metal layer according to another embodiment of the present disclosure.
Figure 4:
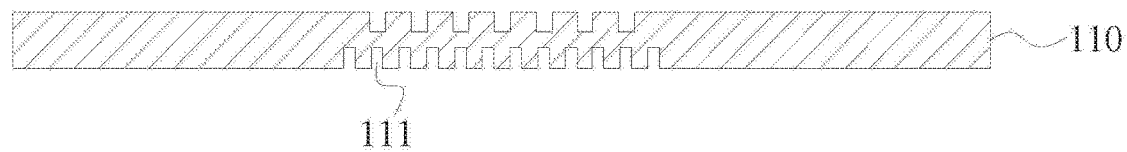
FIG. 4 is a schematic structural diagram of a metal layer according to another embodiment of the present disclosure.

According to an embodiment of the present disclosure, the recessed portions of the metal layer may extend through the metal layer (that is, the recessed portions are through holes) (see FIG. 1). Alternatively, according to other embodiments of the present disclosure, a depth of the recessed portions of each metal layer may be smaller than the thickness of the metal layer (that is, the recessed portions are a non-through holes), and the metal layer may have non-through holes on one side (this situation is not shown in the figure). Alternatively, non-through holes may be provided on both sides of each metal layer (see FIGS. 2 to 4). When both sides of the metal layer have non-through holes, the structure and arrangement of the non-through holes on both sides may be the same or different. For example, the cross-sectional shapes, sizes, and spacings of the non-through holes on both sides may be the same and the non-through holes are arranged overlapped (see FIG. 2), or the cross-sectional shapes, sizes, and spacings of the non-through holes on both sides are the same, but the non-through holes are staggered (see FIG. 3), or the cross-sectional shapes of the non-through holes on both sides are the same but the sizes and spacings are different (see FIG. 4), which are not listed here one by one.

According to an embodiments of the present disclosure, the structures of the recessed portions in the plurality of the metal layers constituting the foldable support may be completely the same (the cross-sectional shapes, sizes, and spacing are the same, and they are all through holes or non-through holes). In addition, the recessed portions of the plurality of the metal layer are arranged overlapping or staggered.

Alternatively, according to other embodiments of the present disclosure, the structures of the recessed portions in the plurality of the metal layers constituting the foldable support may be different. When the structures of the recessed portions in the plurality of metal layers are different, the foldable support may be formed by the arrangement and combination of multiple metal layers described above.

For example, according to a specific embodiment of the present disclosure, referring to FIG. 1, the foldable support includes two metal layers. The recessed portions of the two metal layers are both through holes, and the recessed portions of the two metal layers are arranged overlapped. Because the foldable support is subjected to different stresses at different positions at the bending region when it is bent, its corresponding bending radius is also different. When folded outwardly, the bending radius of the foldable support near the flexible display panel side is larger, and the bending radius of the foldable support away from the flexible display panel side is smaller. When folded inwardly, the bending radius of the foldable support near the flexible display panel side is smaller, and the bending radius of the foldable support away from the flexible display panel side is larger. By providing a plurality of metal layers in the present disclosure, the recessed portions of the plurality of metal layers can respectively match different bending radii, thereby improving the bending performance of the foldable support and the performance of restoring flatness after bending, and the through hole has a longer stress release path, which can further improve the bending performance of the foldable support.

Figure 5:
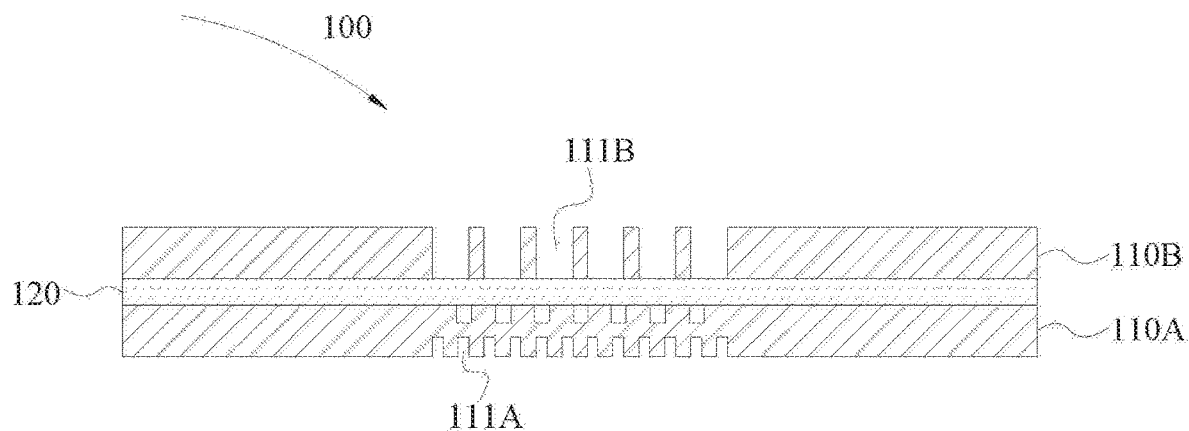
FIG. 5 is a schematic structural diagram of a foldable support according to an embodiment of the present disclosure.

According to a specific embodiment of the present disclosure, referring to FIG. 5, the foldable support includes two metal layers. The recessed portions 111A in the metal layer 110A are non-through holes, and both sides of the metal layer 110A are provided with the above-described recessed portions 111A. The recessed portions 111A on both sides of the metal layer 110A have different structures (the cross-sectional sizes and spacings are different). The recessed portions 111B in the metal layer 110B are through holes. Therefore, non-through holes are provided on both sides of the metal layers, and the non-through holes on both sides of the metal layers can be respectively matched with different bending radii during bending, which can further improve the bending performance of the foldable support and the performance of restoring flatness after bending.

Figure 6:
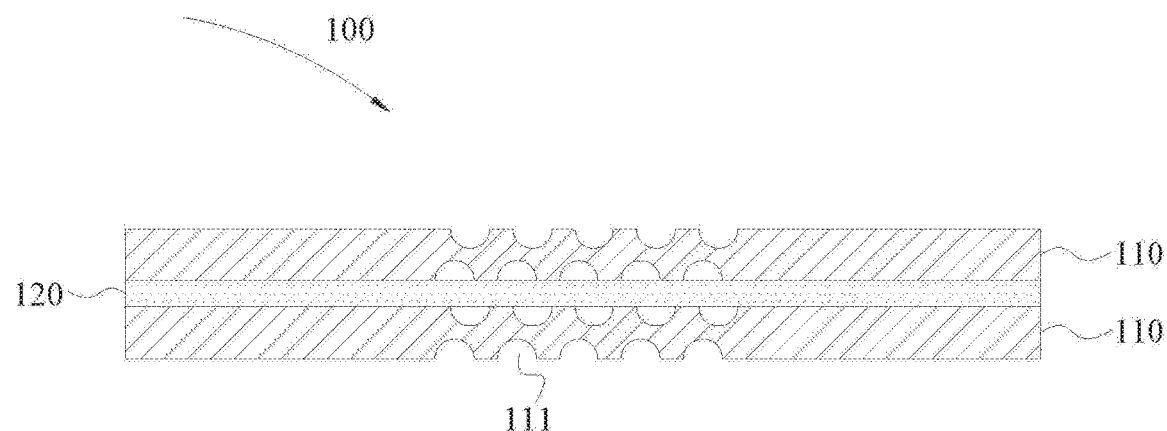
FIG. 6 is a schematic structural diagram of a foldable support according to another embodiment of the present disclosure.

According to a specific embodiment of the present disclosure, referring to FIG. 6, the foldable support includes two metal layers 110, and the recessed portions 111 in the two metal layers 110 are non-through holes, and non-through holes are provided on both sides of each metal layer. The structures of the two metal layers are exactly the same, and the recessed portions on both sides of each metal layer have the same structure, but are arranged in a staggered arrangement. Thereby, the bending performance of the foldable support and the performance of restoring flatness after bending can be further improved.

Figure 7:
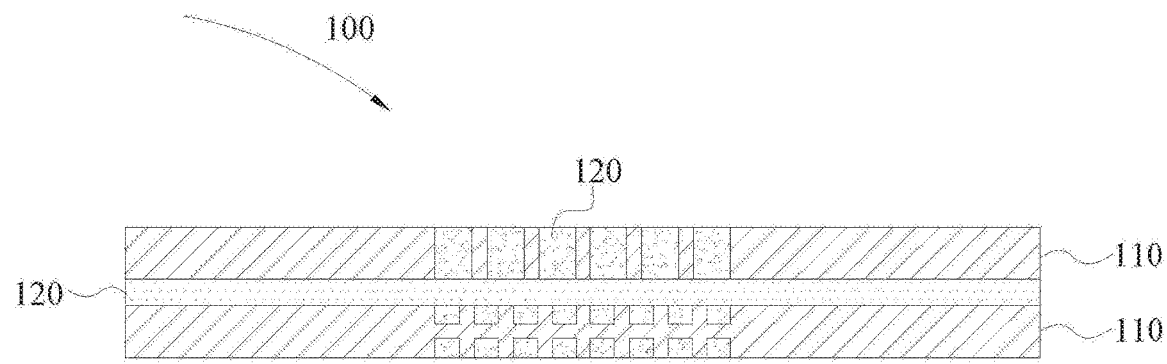
FIG. 7 is a schematic structural diagram of a foldable support according to another embodiment of the present disclosure.

According to a specific embodiment of the present disclosure, referring to FIG. 7, the foldable support includes two metal layers. The recessed portions of one metal layer are non-through holes, and both sides of the metal layer have non-through holes. The non-through holes on both sides of the metal layer can have the same structure and can be arranged overlapping. The recessed portions of the other metal layer are through holes. Thus, the bending performance of the foldable support and the performance of restoring flatness after bending can be further improved.

Figure 8:
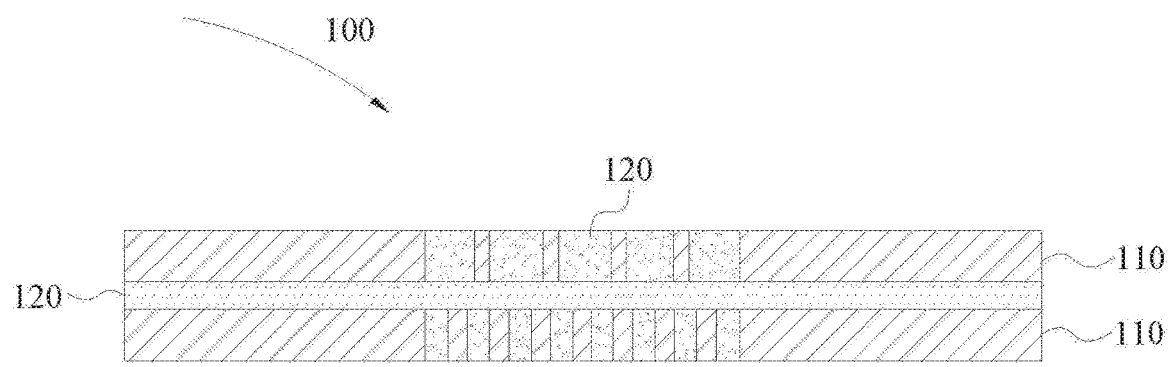
FIG. 8 is a schematic structural diagram of a foldable support according to another embodiment of the present disclosure.
Figure 9:
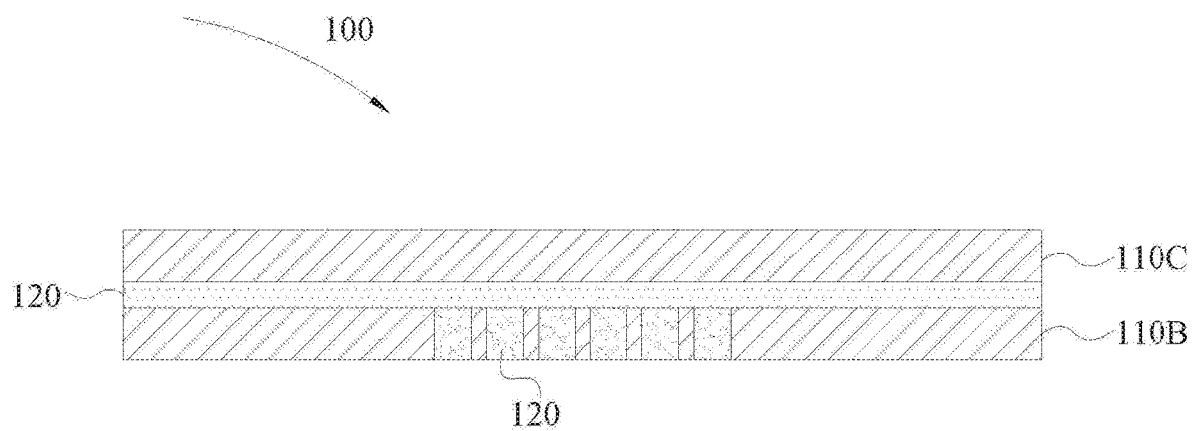
FIG. 9 is a schematic structural diagram of a foldable support according to another embodiment of the present disclosure.

According to a specific embodiment of the present disclosure, referring to FIG. 8, the foldable support includes two metal layers. The recessed portions of the two metal layers are through holes, and the cross-sectional sizes and spacings of the recessed portions of the two metal layers are both different. Thus, the bending performance of the foldable support and the performance of restoring flatness after bending can be further improved.

The specific sizes and arrangement of the non-through holes of the metal layer (the depth of the recessed portions is less than the thickness of the metal layers) and the through holes (the recessed portions extend through the metal layer) are not particularly limited, as long as the non-through holes and through holes of the plurality of the metal layers and the corresponding bending radius match, those skilled in the art can design according to the actual product.

The cross-sectional shapes of the recessed portions (that is, the cross-sectional shape of each of the openings) are not particularly limited. For example, the cross-sectional shapes of the recessed portions may be circular, oval, or polygonal. Specifically, for example, the cross-sectional shape of each of the plurality of recessed portions is rectangular, or the cross-sectional shapes of a portion of the plurality of recessed portions are circular, and the cross-sectional shapes of another portion of the recessed portions are oval. They are not listed here one by one.

The specific size of the cross section of the recessed portion is not particularly limited, as long as the foldable support can obtain a good bending effect, and at the same time can provide a flat support for the flexible display panel, those skilled in the art can design according to specific conditions.

According to an embodiment of the present disclosure, the foldable support 100 may include a plurality of metal layers 110, and the constituent materials of the plurality of metal layers 110 may be the same or different, specifically, the materials of at least two metal layers in the plurality of metal layers 110 are not completely the same. For example, one metal layer can consist of hard metal, and one metal layer can consist of soft metal. Therefore, while ensuring that the foldable support has a good bending effect, it can also give the foldable support other properties (such as heat dissipation and electrical conductivity), which can make the foldable support match different functional requirements of the flexible display panel.

According to an embodiment of the present disclosure, a material constituting the metal layers 110 includes a hard metal, and the hard metal may include at least one of special steel (such as stainless steel or other types of special steel), nickel, titanium, a nickel alloy, and a titanium alloy, but the material is not limited to the above described materials. When at least one of the plurality of the metal layers consists of the above-described hard metal, the material constituting other metal layers may further include a soft metal. The soft metal may include at least one of copper, silver, tin, copper alloy, silver alloy, and tin alloy, but the soft metal material is not limited to the above described materials. For example, the foldable support 100 includes two metal layers 110, one of which can consist of hard metal, and the other of which can consist of soft metal. Therefore, the foldable support has a good folding effect and also has good heat dissipation and electrical conductivity, which can match different functional requirements of the flexible display panel.

As described above, the plurality of metal layers 110 constituting the foldable support 100 of the present disclosure may each have a plurality of recessed portions. Alternatively, according to an embodiment of the present disclosure, a portion of the plurality of metal layers 110 constituting the foldable support 100 have recessed portions, and other portion of the plurality of metal layers does not have the recessed portions described above. Specifically, referring to FIG. 9, the foldable support 100 may include two metal layers 110 in which the metal layer 110C does not have recessed portion at the bending region, and the metal layer 110B has a plurality of recessed portions at the bending region. The recessed portions extend through the metal layer 110B and the materials of the metal layer 110C and the metal layer 110B may be the same (for example, both are made of hard metal), therefore, while ensuring that the foldable support has a better bending effect, the fabricating process can be simplified. Alternatively, the materials of the metal layer 110C and the metal layer 110B may be different (for example, they are made of hard metal and soft metal, respectively). Therefore, while ensuring that the foldable support has a good bending effect, it can not only simplify the fabricating process, but can also give the foldable support other properties (such as conductivity, heat dissipation, etc.).

According to an embodiment of the present disclosure, when the metal layer 110C does not have the above-described recessed portions at the bending region, the thickness of the metal layer 110C at the bending region is less than 0.1 mm. Thus, during bending, the thickness of the metal layer at the bending region is relatively thin, such that the entire foldable support can obtain a better bending effect. There is no particular restriction on the relationship between the thickness at the bending region and the thickness at the non-bending region of the metal layer in which the above described recessed portions are not provided. For example, the thickness of the metal layer 110C at the bending region is less than 0.1 mm, and the thickness at the non-bending region may be greater than 0.1 mm (this situation is not shown in the figure), or the thickness of the metal layer 110C at the bending region and the non-bending region is the same, and both are less than 0.1 mm (see FIG. 9).

According to an embodiment of the present disclosure, referring to FIG. 1, the foldable support 100 may include two metal layers 110, the buffer structure 120 is located between the two metal layers 110, and the buffer structure 120 is a continuous structure, that is, the buffer structure 120 is provided between the two metal layers 110 at the non-bending region and the bending region. The buffer structure 120 may be made of a polymer material with high resilience. The buffer structure between the two metal layers may be deformed as the foldable support is bent when bending. When the foldable support is bent and then restored to flatness, the buffer structure between the two metal layers can rebound to the original state, which provides a good buffer function. At the same time, the buffer structure between the two metal layers can also bond the two metal layers together, which can improve the bonding force between the two metal layers, and ensure the stability of the foldable support. In this embodiment, the recessed portions 111 may be filled with air. In order to improve the supporting effect of the foldable support on the flexible display panel, a planarization layer may be provided between the foldable support and the flexible display panel to prevent the uneven structure of the bending region from adversely affecting the display of the flexible display panel.

The specific material of the buffer structure is not particularly limited so long as it has a high resilience. For example, according to an embodiment of the present disclosure, a constituent material of the buffer structure 120 may be silica gel or polyurethane (PU).

Alternatively, according to an embodiment of the present disclosure, referring to FIGS. 7 to 11, the plurality of recessed portions 111 of the metal layer 110 may be provided with a buffer structure 120. The buffer structure in the recessed portions can provide a good buffer function, which can further improve the bending performance of the foldable support and the performance of restoring flatness after bending. According to an embodiment of the present disclosure, when the recessed portions 111 are filled with the buffer structure 120, the polymer material constituting the buffer structure 120 may not only require higher resilience, but may also have a better planarization function to improve the flatness of the foldable support at the bending region, it can better support the flexible display panel and avoid the uneven structure of the bending region to adversely affect the display of the flexible display panel.

Figure 10:
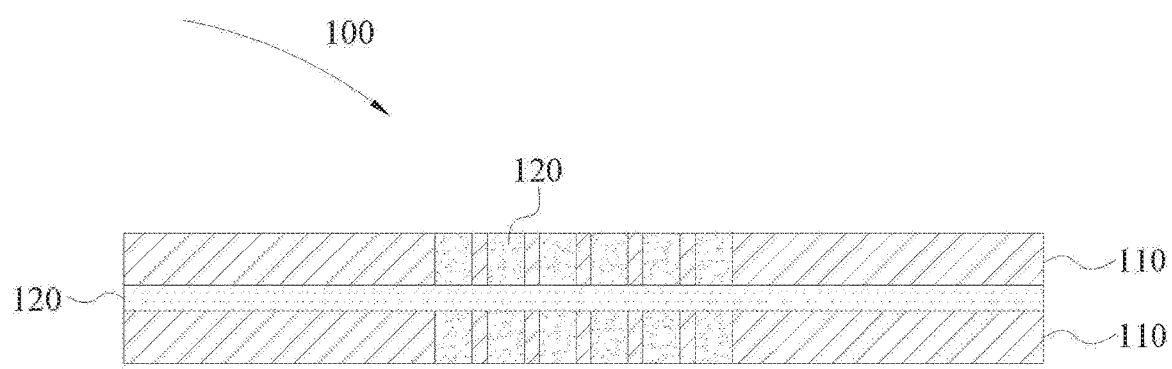
FIG. 10 is a schematic structural diagram of a foldable support according to another embodiment of the present disclosure.

For example, according to a specific embodiment of the present disclosure, referring to FIG. 10, the foldable support 100 includes two metal layers 110, each of which having a plurality of recessed portions, and the plurality of recessed portions each extending through the metal layer, and the structures of the recessed portions in the two metal layers 110 are the same, and they are arranged in an overlapping arrangement. At the bending region and the non-bending region, the buffer structure 120 is disposed between the two metal layers and, at the bending region, the buffer structure 120 is also disposed in the recessed portions. Thus, a good bending effect of the foldable support can be obtained.

Figure 11:
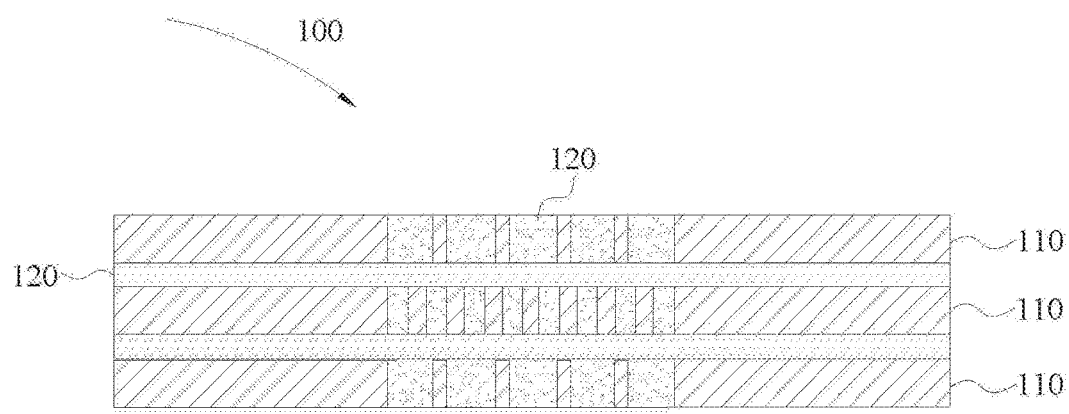
FIG. 11 is a schematic structural diagram of a foldable support according to another embodiment of the present disclosure.

According to a specific embodiment of the present disclosure, referring to FIG. 11, the foldable support 100 may further include three metal layers 110, each of which having a plurality of recessed portions, and each of the plurality of recessed portions extending through the metal layer. The structures of the recessed portions of the three metal layers are different at the bending region and the non-bending region, the buffer structure 120 is disposed between two adjacent metal layers, and, at the bending region, the buffer structure 120 is further disposed in the recessed portions. Thus, during bending, the plurality of recessed portions in different metal layers can be respectively matched with different bending radii, thereby further improving the bending performance of the foldable support and the performance of restoring flatness after bending.

According to an embodiment of the present disclosure, the foldable support having the above described structure can be folded inwardly or folded outwardly, and the foldable support can be folded in a range of 0-180 degrees.

According to other embodiments of the present disclosure, the two adjacent metal layers at the bending region may not be connected to each other, so that the recessed portions of the adjacent two metal layers can slide relative to each other. Therefore, the stress generated by the two metal layers will not be transmitted to each other and, as a result, the deformation of the recessed portions of different metal layers can better match the bending radius of the corresponding metal layer, improve the bending limit ability of the foldable support (the bending radius decreases, and the bending resistance angle increases), further improve the bending performance of the foldable support and the performance of restoring flatness after bending, so that the foldable support can obtain a better bending effect. For instance, the foldable support can achieve a bending greater than 180 degrees, and at the same time, it can better reduce the impact of the foldable support on the flexible display panel.

According to the embodiment of the present disclosure, when the two adjacent metal layers are not connected at the bending region, the friction coefficient between the two adjacent metal layers is less than 0.5 at the bending region. Therefore, the friction between the adjacent two metal layers at the bending region is small, so that the portions of the adjacent two metal layers at the bending region can slide relative to each other, when bending, the bending stress of two adjacent metal layers will not be transmitted to each other, that is, the lower metal layer is not affected by the bending stress of the upper metal layer. The above-described metal layer can be bent according to the bending radius of the upper metal layer, and the lower metal layer can be bent according to the bending radius of the lower metal layer. The bending regions of the upper and lower metal layers can independently match different bending radii, so that the plurality of recessed portions of different metal layers can be better matched with different bending radii, the bending limit ability of the foldable support is improved, and the bending performance of the foldable support and the performance of restoring flatness after bending are significantly improved.

The specific manner in which the metal layers are not connected at the bending region is not particularly limited, as long as the friction coefficient between two adjacent metal layers at the bending region is less than 0.5. For example, an air gap is provided between two adjacent metal layers at the bending region, or a single-sided adhesive layer is provided between the adjacent two metal layers at the bending region, and the single-sided adhesive layer is attached on the metal layer, or a lubricating layer is provided between two adjacent metal layers at the bending region, or a side of the metal layer facing the metal layer adjacent thereto at the bending region is surface-treated.

According to an embodiment of the present disclosure, when adjacent metal layers at the bending region are not connected, the connection manner between the adjacent two metal layers at the non-bending region is not particularly limited, for example, the adjacent two metal layers at the non-bending region may be connected by welding or structural components, or a buffer structure may be provided between the adjacent two metal layers to achieve the connection between the adjacent metal layer at the non-bending region. Specifically, the welding may be soldering or laser spot welding, etc., and the structural components may be screws, snaps, or other structures.

According to an embodiment of the present disclosure, the manner in which adjacent metal layers at the bending region are not connected and the manner in which adjacent metal layers at the non-bending region are connected may be arranged and combined to form different connection manners in the foldable support.

Figure 12:
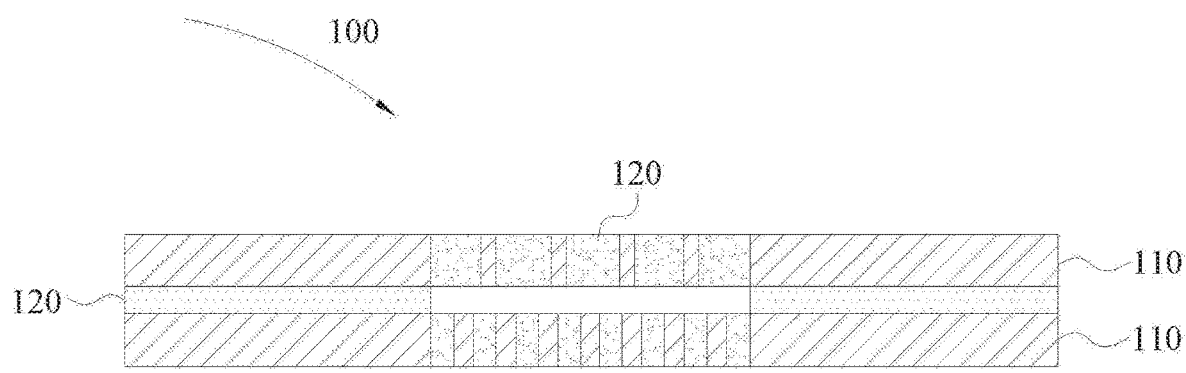
FIG. 12 is a schematic structural diagram of a foldable support according to another embodiment of the present disclosure.
Figure 13:
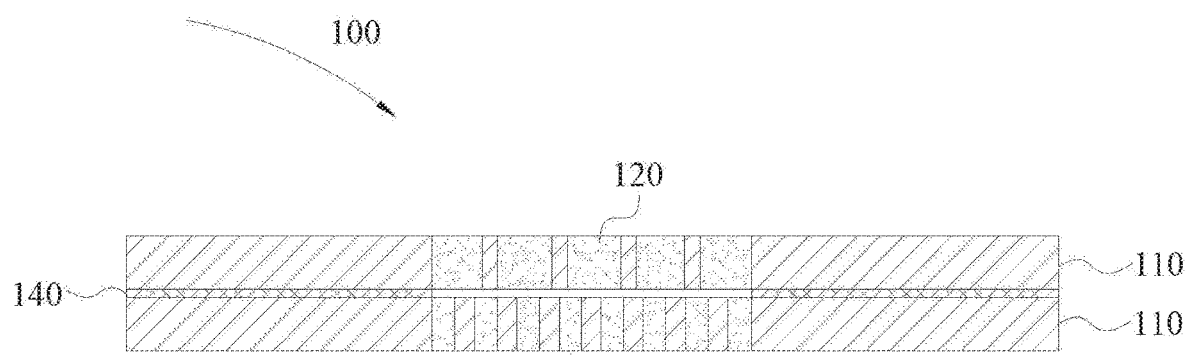
FIG. 13 is a schematic structural diagram of a foldable support according to another embodiment of the present disclosure.

For example, according to a specific embodiment of the present disclosure, an air gap may exist between two adjacent metal layers 110 at a bending region, and two adjacent metal layers 110 may be connected through a buffer structure 120 at the non-bending region (refer to FIG. 12), or the two adjacent metal layers 110 are connected by welding at the non-bending region (such as the welding layer 140 shown in FIG. 13). Thus, during bending, the two adjacent metal layers at the bending region can relatively slide, and the adjacent metal layers at the non-bending region have a good connection. In this embodiment, in order to further improve the display effect of the flexible display panel, the length of the air gap between two adjacent metal layers in the metal layer thickness direction T is less than 200 μm. Accordingly, in a case where relative sliding occurs between two adjacent metal layers at the bending region, the flexible display panel is prevent from being depressed due to an excessively large air gap.

Figure 14:
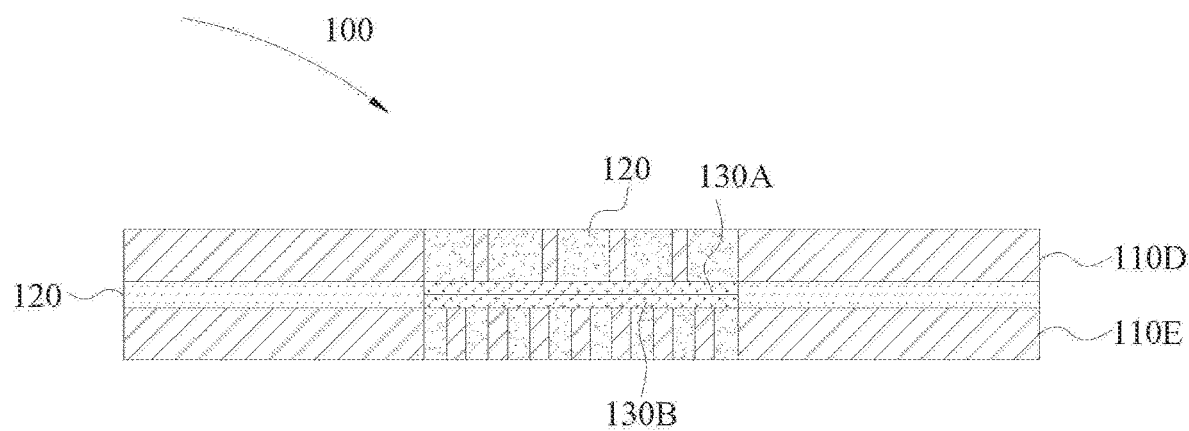
FIG. 14 is a schematic structural diagram of a foldable support according to another embodiment of the present disclosure.
Figure 16:
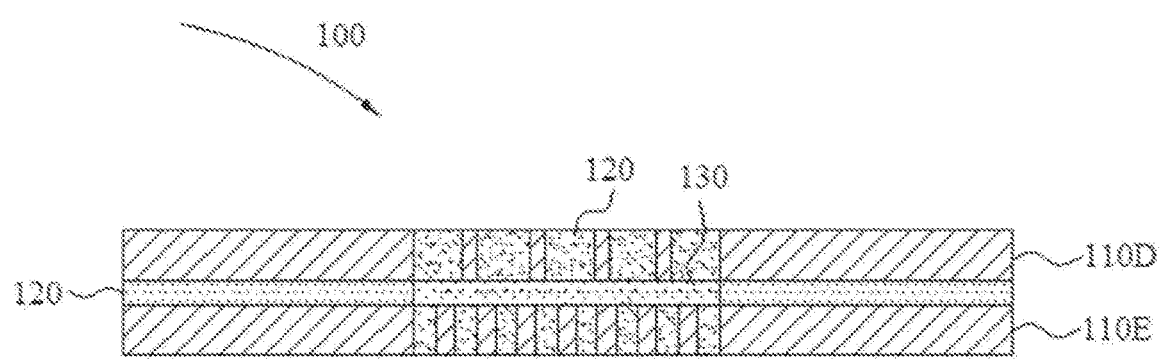
FIG. 16 is a schematic structural diagram of a foldable support according to another embodiment of the present disclosure.

According to a specific embodiment of the present disclosure, at the bending region, there may be a single-sided adhesive layer 130 between two adjacent metal layers 110, and the single-sided adhesive layer 130 is attached to the metal layer 110. Specifically, referring to FIG. 16, at the bending region, there may be one single-sided adhesive layer 130 between two adjacent metal layers 110. The single-sided adhesive layer 130 is filled in the gap between two adjacent metal layers 110, and the single-sided adhesive layer 130 is attached to the metal layer 110 on one side thereof. Then, the metal layer 110 on the other side is in contact with the non-adhesive surface of the single-sided adhesive layer 130, and adjacent metal layers at the non-bending region may be connected through the buffer structure 120. Alternatively, referring to FIG. 14, at the bending region, there are two single-sided adhesive layers 130 between two adjacent metal layers 110. One of the single-sided adhesive layer 130A is attached to one metal layer 110D, the other of the single-sided adhesive layer 130B is attached to the other metal layer 110E, and the non-adhesive surface of the single-sided adhesive layer 130A and the non-adhesive surface of the single-sided adhesive layer 130B are in contact with each other. Also, adjacent metal layers at the non-bending region may be connected through the buffer structure 120. Therefore, the relative sliding between adjacent metal layers at the bending region during bending can also be achieved, and the adjacent metal layers at the non-bending region have a good connection.

According to a specific embodiment of the present disclosure, a lubricating layer can be provided between two adjacent metal layers at the bending region. For example, one siloxane hardened layer is provided on the opposite sides of two adjacent metal layers respectively, and the two siloxane hardened layers are in contact with each other. Because the siloxane hardened layer has a smooth surface, the adjacent metal layer can be relatively slid in the bending region during bending. Alternatively, an oil layer is provided between two adjacent metal layers, and relative sliding of adjacent metal layers in the bending region can also be achieved.

According to a specific embodiment of the present disclosure, at the bending region, the side of the metal layer facing the metal layer adjacent thereto is surface-treated, and the friction between the adjacent metal layers is reduced through the surface treatment so that relative sliding of adjacent metal layers in the bending region can be achieved.

According to an embodiment of the present disclosure, the material of the metal layer in the bending region and the material in the non-bending region may be different, and the elastic modulus of the material of the metal layer at the non-bending region is greater than that of the metal layer at the bending region. Thus, the metal material at the bending region has a small elastic modulus. The metal layer in the bending region can have a large amount of deformation during bending, thereby further improving the bending performance of the foldable support at the bending region and, at the same time, enabling the foldable support to have higher support performance at the non-bending region. In this embodiment, the metal layer in the bending region and the metal layer in the non-bending region may be connected together by welding.

According to an embodiment of the present disclosure, the foldable support may further include a graphite copper layer, and the graphite copper layer is located on a side of the metal layer facing away from the other metal layers at the non-bending region. The graphite copper layer has good heat dissipation, conductivity, and electronic shielding performance, and has a thin thickness, which can improve the heat dissipation, conductivity, and electronic shielding performance of the foldable support.

According to an embodiment of the present disclosure, the foldable support may further include a polymer layer, where the polymer layer is located on a side of the metal layer at the bending region facing away from other metal layers. The polymer layer can be made of a high resilience polymer material, and the thickness of the polymer layer can be 30-200 µm. Therefore, the elastic modulus of the foldable support at the bending region can be further reduced, and the bending performance of the foldable support at the bending region can be further increased.

Figure 15:
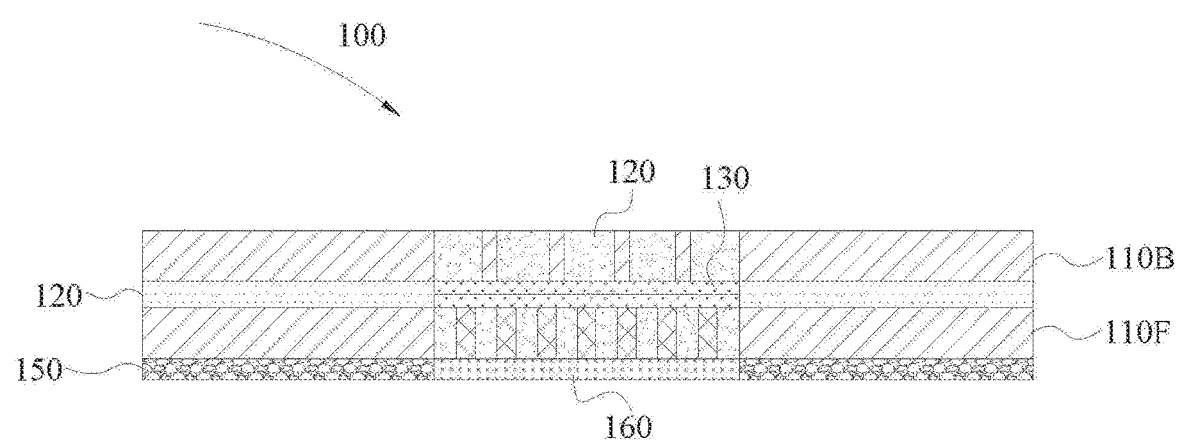
FIG. 15 is a schematic structural diagram of a foldable support according to another embodiment of the present disclosure.

According to a specific embodiment of the present disclosure, referring to FIG. 15, the foldable support 100 includes two metal layers 110, and the recessed portions of the two metal layers 110 are both through holes. One metal layer 110B is made of hard metal, such as stainless steel, and the other metal layer 110F is made of copper. The portion of the non-bending region is made of stainless steel, and at the non-bending region, the graphite copper layer 150 is disposed on the side of the metal layer 110F away from the metal layer 110B. At the bending region, a polymer layer 160 is disposed on a side of the metal layer 110F facing away from the metal layer 110B. Therefore, the foldable support can obtain a good bending effect. The foldable support is applicable to foldable display products with a minimum outer folding radius of 4 mm and an inner folding radius of 2 mm, which can meet the requirements of a smaller bending radius.

According to an embodiment of the present disclosure, the thickness of each metal layer may be 0.015 to 0.5 mm, such as 0.015 mm, 0.03 mm, 0.05 mm, 0.08 mm, 0.1 mm, 0.2 mm, 0.3 mm, 0.4 mm, and 0.5 mm. Therefore, setting the thickness of the metal layer within the above range can ensure that the metal layer has better bending performance and supporting performance.

According to another aspect of the present disclosure, the present disclosure provides a fabricating method of a foldable support 100, which is the foldable support 100 in the above-described embodiment. The fabricating method includes providing at least two metal layers, each of which is provided with a non-bending region 10 and at least one bending region 20; performing a patterned opening process on a portion of the at least one metal layer 110 located in the bending region 20 to form a plurality of recessed portions 111; and providing a buffer structure 120, where the buffer structure 120 is disposed at at least one of the following positions: between two adjacent metal layers 110 and in a plurality of the recessed portions 111 of the metal layer 110.

Among them, the patterned opening process is a technical means well known to those skilled in the art, and will not be described in detail herein.

In another aspect of the present disclosure, the present disclosure provides a display device. According to an embodiment of the present disclosure, referring to FIG. 17, the display device includes a flexible display panel 200 and a foldable support 100, in which, the foldable support 100 is the foldable support described above, and the foldable support 100 is disposed on a side facing away from the display surface 210 of the flexible display panel 200. Thus, the display device has a good folding effect and a display effect.

Figure 17:
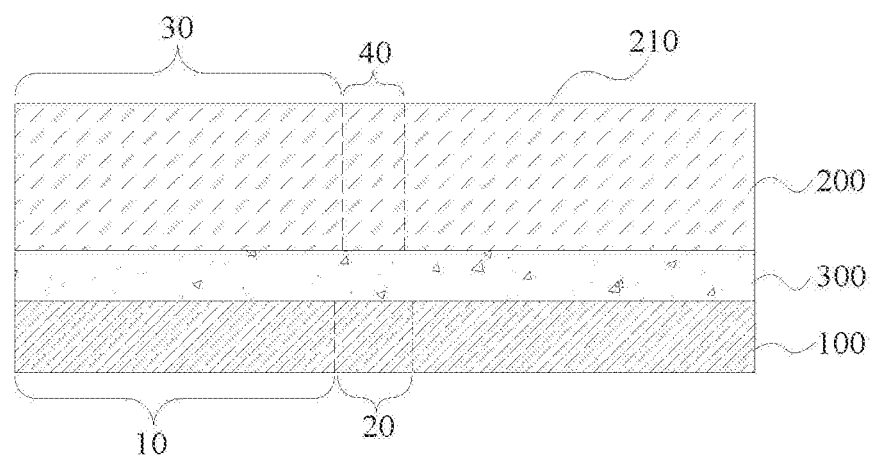
FIG. 17 is a schematic structural diagram of a display device according to an embodiment of the present disclosure.

According to an embodiment of the present disclosure, referring to FIG. 17, the display device may further include a flat layer 300 disposed between the foldable support 100 and the flexible display panel 200. Therefore, a flat contact surface can be provided for the flexible display panel, and the uneven structure in the bending region of the foldable support can be prevented from adversely affecting the display effect of the flexible display panel.

According to an embodiment of the present disclosure, the foldable support may include a hard metal layer and a soft metal layer, in which the hard metal layer is disposed near the flexible display panel. Thus, a good supporting effect can be provided for the flexible display panel.

According to an embodiment of the present disclosure, referring to FIG. 17, the flexible display panel 200 is provided with a non-bending region 30 and at least one bending region 40 (only one bending region 40 is shown in the figure), and the orthographic projection of the bending region 40 of the flexible display panel 200 on the foldable support 100 is within the range of the bending region 20 of the foldable support 100. Therefore, it is possible to ensure that the bending of the foldable support matches the bending of the flexible display panel and, at the same time, it has a good supporting effect on the flexible display panel.

In the description of the present disclosure, the orientations or positional relationships indicated by the terms "up", "down" and the like are based on the orientations or positional relationships shown in the accompanying drawings, which is only for the convenience of describing the disclosure and does not require that the disclosure must be constructed and operated in a specific orientation, so it cannot be understood as a limitation on the disclosure.

In the description of this specification, the description with reference to the terms "one embodiment", "another embodiment", etc. means that a specific feature, structure, material, or characteristic described in conjunction with the embodiment is included in at least one embodiment of the present disclosure. In this specification, the schematic expressions of the above terms are not necessarily directed to the same embodiment or example. Moreover, the particular features, structures, materials, or characteristics described may be combined in any suitable manner in any one or more embodiments or examples. In addition, without any contradiction, those skilled in the art may incorporate and combine different embodiments or examples and features of the different embodiments or examples described in this specification. In addition, it should be noted that in this specification, the terms "first" and "second" are used for description purposes only, and cannot be understood as indicating or implying relative importance or implicitly indicating the number of technical features indicated.

Although the embodiments of the present disclosure have been shown and described above, it can be understood that the above embodiments are exemplary and should not be construed as limitations on the present disclosure. Those skilled in the art can make changes, modifications, replacements, and variations to the above described embodiments within the scope of the present disclosure.

What is claimed is:

1. A foldable support having a non-bending region and at least one bending region, comprising:
   at least two metal layers, at least one of the at least two metal layers comprising a plurality of recessed portions at the at least one bending region; and
   a buffer structure located at at least one of the following positions: a position between two adjacent metal layers and a position in the plurality of recessed portions of the at least one of the at least two metal layers;
   wherein a material of the at least two metal layers at the bending region is different from a material of the at least two metal layers at the non-bending region, and an elastic modulus of the material of the at least two metal layers at the non-bending region is greater than an elastic modulus of a material of the at least two metal layers at the bending region.

2. The foldable support of claim 1, wherein the recessed portions are configured to extend through the at least two metal layers.

3. The foldable support of claim 1, wherein the foldable support is configured to meet at least one of the following conditions:
   materials of the at least two metal layers are not completely the same;
   a thickness of each of the at least two metal layers is in the range of 0.015 to 0.5 mm; and
   a thickness of each of the at least two metal layers is less than 0.1 mm at the bending region when the at least two metal layers are not provided with the recessed portions at the bending region.

4. The foldable support of claim 1, wherein a friction coefficient between two adjacent metal layers at the bending region is less than 0.5.

5. The foldable support of claim 1, wherein the foldable support further comprises at least one of the following structures:
   a graphite copper layer located at a side of a metal layer facing away from the other metal layers at the non-bending region; and
   a polymer layer located at a side of a metal layer facing away from the other metal layers at the bending region.

6. The foldable support of claim 1, wherein each of two metal layers among of the at least two metal layers, have the plurality of the recessed portions at the bending region, and the recessed portions extending through each of the two metal layers;
   wherein the buffer structure is disposed between the two metal layers at the non-bending region; and
   wherein the buffer structure is also disposed in the plurality of recessed portions at the bending region, two single-sided adhesive layers are disposed between the two metal layers and the two single-sided adhesive layers are respectively attached to the two metal layers, or one single-sided adhesive layers is disposed between the two metal layers, and the one single-sided adhesive layer is attached to a metal layer on one side, and a metal layer on the other side is in contact with a non-adhesive surface of the one single-sided adhesive layer.

7. The foldable support of claim 1, wherein a material of the at least two metal layers in the bending region is copper, and a material of the at least two metal layers in the non-bending region is stainless steel, a graphite copper layer being disposed on a side of a metal layer facing away from the other metal layers at the non-bending region, a polymer layer being disposed on a side of a metal layer facing away from the other metal layers at the bending region, and the graphite copper layer and the polymer layer being disposed on the same layer.

8. The foldable support of claim 3, wherein:
   at least one of the at least two metal layers is made of materials comprising a hard metal which comprises at least one of: special steel, nickel, titanium, nickel alloy, and titanium alloy; and
   a metal layer other than the at least one metal layer among the at least two metal layers is made of materials comprising a soft metal, the soft metal comprising at least one of: copper, silver, tin, copper alloy, silver alloy, and tin alloy.

9. The foldable support of claim 4, wherein a single-sided adhesive layer exists between two adjacent metal layers at the bending region, and the single-sided adhesive layer is attached to the metal layers.

10. A display device, comprising:
    a flexible display panel and a foldable support, the foldable support having a non-bending region and a bending region, the foldable support comprising:
    at least two metal layers, wherein at least one of the at least two metal layers comprises a plurality of recessed portions at the at least one bending region;
    a buffer structure located at at least one of the following positions: a position between two adjacent metal layers and a position in the plurality of recessed portions of the at least one of the at least two metal layers;
    wherein a material of the at least two metal layers at the bending region is different from a material of the at least two metal layers at the non-bending region, and an elastic modulus of the material of the at least two metal layers at the non-bending region is greater than an elastic modulus of a material of the at least two metal lavers at the bending region; and
    wherein the foldable support is located on a side facing away from a display surface of the flexible display panel.

11. The display device of claim 10, wherein the display device is configured to meet at least one of the following conditions:
    the display device comprises a flat layer which is disposed between the foldable support and the flexible display panel; and
    the foldable support comprises a hard metal layer and a soft metal layer, wherein the hard metal layer is disposed near the flexible display panel.

* * * * *